United States Patent
Blondy et al.

(10) Patent No.: US 8,941,452 B2
(45) Date of Patent: Jan. 27, 2015

(54) ELECTROMECHANICAL MICROSYSTEMS WITH AIR GAPS

(75) Inventors: Pierre Blondy, Limoges (FR); Stanis Courreges, Imbsheim (FR); Arnaud Pothier, Condat sur Vienne (FR); Jean-Christophe Orlianges, Bugeat (FR)

(73) Assignees: Universite de Limoges, Limoges (FR); Centre National de la Recherche Scientifique (CNRS), Paris (FR)

( * ) Notice: Subject to any disclaimer, the term of this patent is extended or adjusted under 35 U.S.C. 154(b) by 0 days.

(21) Appl. No.: 13/814,928

(22) PCT Filed: Aug. 11, 2011

(86) PCT No.: PCT/EP2011/063856
§ 371 (c)(1),
(2), (4) Date: Jun. 28, 2013

(87) PCT Pub. No.: WO2012/020095
PCT Pub. Date: Feb. 16, 2012

(65) Prior Publication Data
US 2013/0270096 A1  Oct. 17, 2013

(30) Foreign Application Priority Data
Aug. 11, 2010 (FR) .................................. 10 56549

(51) Int. Cl.
H01H 51/22 (2006.01)
B81B 3/00 (2006.01)

(52) U.S. Cl.
CPC ............. *B81B 3/0051* (2013.01); *B81B 3/0086* (2013.01); *B81B 3/0008* (2013.01)
USPC ............................................ 335/78; 200/181

(58) Field of Classification Search
CPC . H01H 59/0009; H01H 57/00; H01H 1/0036; H01H 2057/006; B81B 2201/014; B81B 2203/0118; B81B 2201/016
USPC ............................................ 335/78; 200/181
See application file for complete search history.

(56) References Cited

U.S. PATENT DOCUMENTS

| | | | |
|---|---|---|---|
| 6,307,169 B1 * | 10/2001 | Sun et al. ...................... | 200/181 |
| 7,944,332 B2 * | 5/2011 | Hilgers ........................ | 200/181 |
| 2003/0058069 A1 | 3/2003 | Schwartz et al. | |
| 2003/0116417 A1 * | 6/2003 | DeReus ........................ | 200/181 |
| 2003/0227361 A1 | 12/2003 | Dickens et al. | |
| 2006/0232365 A1 * | 10/2006 | Majumder et al. .............. | 335/78 |
| 2009/0021884 A1 | 1/2009 | Nakamura | |
| 2009/0159410 A1 * | 6/2009 | Wang et al. ................... | 200/181 |

* cited by examiner

*Primary Examiner* — Bernard Rojas
(74) *Attorney, Agent, or Firm* — Blakely Sokoloff Taylor & Zafman

(57) ABSTRACT

The present invention relates to an microelectromechanical system (1) comprising: a base (15) comprising a substrate (20) and a substrate electrode (40); a moveable beam (30); a voltage generator (10) able to generate a potential difference between the beam (30) and the substrate electrode (40); and at least one mechanical stop (70) connected to the beam and designed to make contact with the base (15) when a potential difference is applied between the beam (30) and the substrate electrode (40), thereby defining an air-filled cavity (80) between the beam (30) and the substrate electrode (40), characterized in that it furthermore comprises an electrical-charge blocking element (50) placed on the substrate (20), said element facing the at least one mechanical stop (70) and being electrically connected to the beam (30).

8 Claims, 3 Drawing Sheets

--PRIOR ART--

--PRIOR ART--

--PRIOR ART--

ELECTROMECHANICAL MICROSYSTEMS WITH AIR GAPS

GENERAL TECHNICAL FIELD

The present application relates to the field of electromechanical microsystems.

PRIOR ART

Electromechanical microsystems (MEMS) are used especially in the design of circuits having switching functions or reconfigurable (agile) circuits. Electromechanical microsystems have for instance an actuator function.

FIG. 1 shows an electromechanical microsystem 1 according to the prior art, more specifically an electrostatic actuator with parallel plates.

This electromechanical microsystem 1 comprises a base 15 comprising a substrate 20, a substrate electrode 40 arranged on said substrate 20, and a mobile beam 30 placed opposite the substrate electrode 40.

A dielectric layer 42 is interposed between the substrate electrode 40 and the mobile beam 30 by also arranging an interval or electrostatic gap 32. This gap typically has a thickness of a few micrometers when the microsystem is in rest position. The dielectric layer 42 can be placed on the substrate electrode 40 or on the mobile beam 30.

According to the embodiment illustrated in FIG. 1, the dielectric layer 42 is placed on the substrate electrode 40 and the mobile beam 30 is separated from the dielectric layer 42 by the electrostatic gap 32.

The mobile beam 30 is illustrated as being held by a suspension spring 34 which illustrates the capacity of elastic deformation of the mobile beam 30.

A voltage generator 10 is connected on request to the beam 30 and to the substrate electrode 40 so that it can apply a difference in potential between the mobile beam 30 and the substrate electrode 40.

During application of a difference in potential between the mobile beam 30 and the substrate electrode 40, the mobile beam 30 shifts and comes into contact with the dielectric layer 42, under the effect of the electrostatic force generated.

Contact between the mobile beam 30 and the substrate electrode 40 is made via the fine dielectric layer 42 covering the mobile beam 30 or the substrate electrode 40.

Several variants are possible.

The mobile beam 30 can for example be fixed to one end and be free at another, the free end coming into contact with the dielectric layer 42 during application of a difference in potential between the mobile beam 30 and the substrate electrode 40.

The mobile beam 30 can also be fixed at its ends on the base 15, but have intrinsic suppleness such that deformation of the mobile beam 30 during application of a difference in potential causes contact of the centre of the mobile beam 30 with the base 15.

These components however do have rapid and non-reversible failures causing limited shelf life and reliability, typically of the order of a few minutes, when the mobile beam 30 is kept constantly in the deformed state and subjected to unipolar voltage feed.

This disadvantage is caused by injection of charges into the base 15 during contact between the beam 30 and the base 15.

In fact, the injection of charges causes the appearance of charge voltage which, according to the type of charge, is opposed to or superposed on the difference in potential applied between the beam 30 and the substrate electrode 40.

Throughout injection of charges into the base 15, or more particularly into the dielectric layer 42, and therefore while charges accumulate, this charge voltage rises until the actuator is blocked. The result is rapid failure of the actuator, for example of the order of a few tens of minutes, very often non-reversible over short time periods.

Several solutions have been proposed for reducing the injection of charges or evacuating the charges injected into the dielectric layer, but these solutions fail to produce sufficient shelf life, in particular for temperatures greater than 25° C.

FIGS. 2 and 3 show, respectively in the rest position and in the activated position, an electromechanical microsystem 1 in which the dielectric layer 42 has been omitted. This electromechanical microsystem 1 is fitted with mechanical stops 70 connected to the periphery of the beam 30.

The mechanical stops 70 can be made from metal, semi-metal, semiconductor, or any other adapted material.

FIGS. 2 and 3 illustrate an electromechanical microsystem 1 which comprises a base 15 comprising a substrate 20, a fixed substrate electrode 40 arranged on the substrate 20 and a mobile beam 30 opposite the substrate electrode 40.

The substrate can for example be made from silicon, or any other adapted material.

In the same way as for FIG. 1, the beam 30 is illustrated as being connected to a suspension spring 34 which illustrates the elastic deformation capacity of the mobile beam 30. The beam 30 has a form adapted to define an internal space 25 between said substrate 20 and the beam 30.

The substrate electrode 40 is arranged on the substrate 20, substantially in the centre of said internal space 25.

A generator 10 is connected to the beam 30 and to the substrate electrode 40 so as to apply on request a difference in potential between the beam 30 and the substrate electrode 40.

FIG. 2 shows the electromechanical microsystem 1 in the rest position, that is, when no difference in potential is applied between the beam 30 and the substrate electrode 40.

There is no contact between the beam 30 and the substrate 20, or between the beam 30 and the substrate electrode 40. The beam 30 is kept at a distance from the substrate 20 and from the substrate electrode 40 by the suspension spring 34, which physically represents the rigidity of the beam 30.

FIG. 3 shows the electromechanical microsystem 1 in the activation position, where a difference in potential is applied between the beam 30 and the substrate electrode 40.

In the activation state, the difference in potential applied between the beam 30 and the substrate electrode 40 causes contact of the stops 70 and of the substrate 20. The stops 70 maintain an air-filled cavity 80 between the beam 30 and the substrate electrode 40.

Therefore, there is no contact between the beam 30 and the substrate electrode 40. The air-filled cavity 80 plays the role of electrical insulator between the beam 30 and the substrate electrode 40.

For example, this air-filled cavity 80 can have a value of the order of 0.1 µm to 2 µm. This value results from the geometry, placement and height of the stops 70.

The thickness of the air-filled cavity 80 can vary to produce different capacity values.

Because of the air-filled cavity 80, the absence of contact between the beam 30 and the substrate electrode 40 both prevents an electrical short circuit and also boosts the shelf life of these elements.

In fact, in conventional embodiments in which insulating material is situated between the beam 30 and the electrode 40, a phenomenon of trapping of electrical charges in the insulating material 42 is noticed during actioning of the electromechanical microsystem 1 such as presented in FIG. 1.

In the known embodiment illustrated in FIGS. 2 and 3, the absence of this insulating material 42 prevents this accumulation of charges in said insulating material 42.

However, charges 24, illustrated schematically in FIG. 3, accumulate in the substrate 20 of the base 15 at the level of a limited surface, which can result in failure of the electromechanical microsystem 1.

This phenomenon of injection of charges and its negative consequences on the shelf life of electromechanical microsystems constitute a major technological issue for the use of these components.

PRESENTATION OF THE INVENTION

The present invention remedies these disadvantages, and proposes an electromechanical microsystem comprising:
- a base comprising a substrate and a substrate electrode fixed to the substrate,
- a mobile beam suspended above the substrate,
- a voltage generator connected by a first terminal to the beam and by a second terminal to the substrate electrode, adapted to generate a difference in potential between the beam and the substrate electrode, and
- at least one mechanical stop connected to the beam and adapted to come into contact with the base during application of a difference in potential between the beam and the substrate electrode defining an air-filled cavity between the beam and the substrate electrode, said electromechanical microsystem being characterised in that it also comprises an element for blocking electrical charges arranged on the substrate, opposite the at least one mechanical stop, and connected electrically to the beam.

According to another advantageous characteristic, said element for blocking electrical charges is constituted by at least one pin.

According to another advantageous characteristic, said blocking element is constituted by a layer of material whereof the electrical resistivity is between 100 MOhms·square and 10 kOhms·square.

According to a variant of this particular embodiment, at least one metal pin is arranged on said layer of material opposite a mechanical stop of the beam.

According to yet another variant, said material constituting the blocking element is an alloy of silicon chrome, carbon of diamond structure, implanted silicon, or conductive oxide.

According to yet another particular embodiment of the electromechanical microsystem in keeping with the present invention, said blocking element comprises at least one metal pin connected to an electrically conductive base arranged on the substrate and connected to the mobile beam, said electrically conductive base being topped by an electrically resistive layer, on which the substrate electrode is arranged.

According to a variant, said substrate is made from material from at least one of the following materials: ceramic, sapphire, quartz, molten silica, crystalline substrates, semiconductors, and polymers.

According to a particular embodiment, said stop is adapted to maintain a thickness of air between the beam and the substrate electrode between 0.1 and 2 μm.

Such an electromechanical microsystem exhibits performances greater than those of current capacitive electromechanical microsystems, and offers a large increase in shelf life and reliability.

PRESENTATION OF FIGURES

Other characteristics, aims and advantages of the invention will emerge from the following description which is purely illustrative and non-limiting and which must be considered in relation to the attached diagrams, in which:

FIG. 1 previously described shows an electromechanical microsystem according to the prior art.

FIGS. 2 and 3 previously described show an electromechanical microsystem according to the prior art fitted with one or more mechanical stops.

In all the figures, similar elements are designated by identical reference numerals.

DETAILED DESCRIPTION

Figure 1:
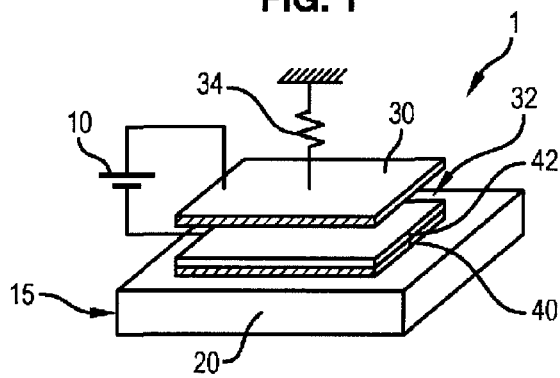
Figure 2:
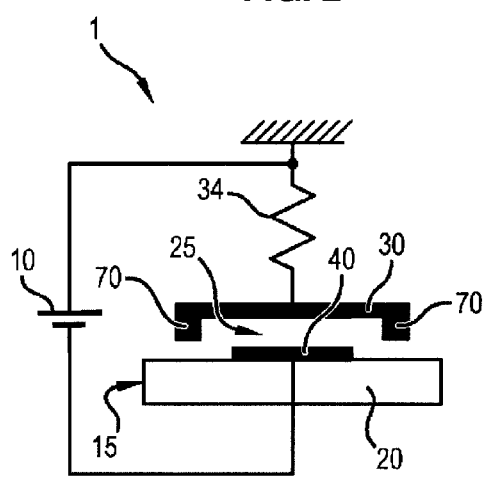
Figure 3:
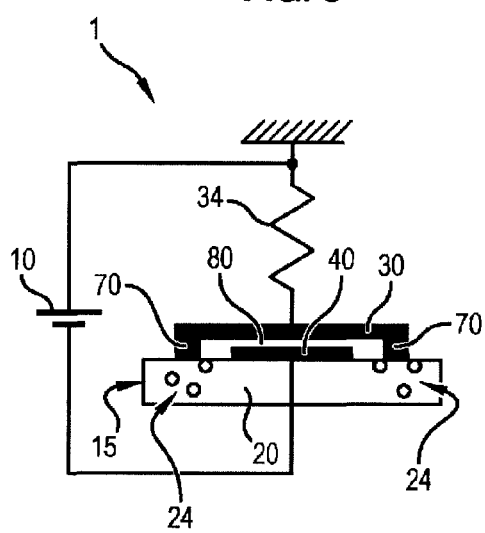
Figure 4:
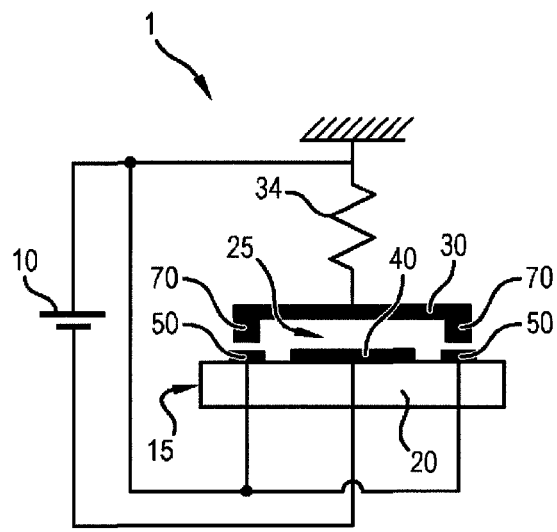
FIGS. 4 and 5 show an electromechanical microsystem according to a particular embodiment of the invention.
Figure 5:
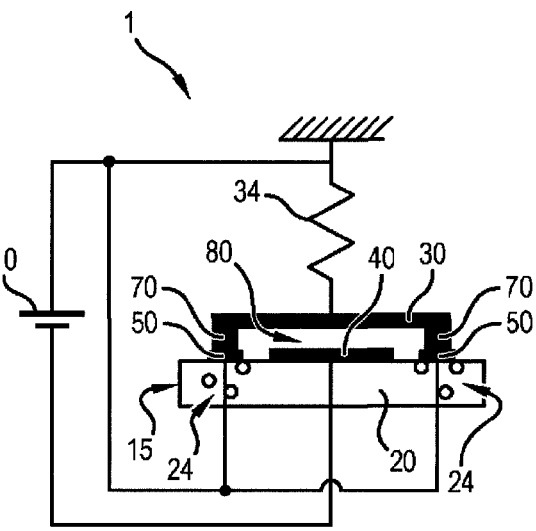

FIGS. 4 and 5 show a particular embodiment of the electromechanical microsystem 1 according to the invention, respectively in the rest state and in the activation state.

This electromechanical microsystem 1 comprises a mobile beam 30 and une base 15 comprising a substrate 20 and a fixed substrate electrode 40 arranged on the substrate 20.

The substrate 20 is typically made from silicon, or any other adapted material, typically of the type of material of ceramic, sapphire, quartz, molten silica, other crystalline substrates, semiconductors, polymers, or any other adapted material.

The mobile beam 30 fitted with stops 70 is arranged above the substrate 20 and is illustrated as being held by a suspension spring 34 which illustrates the elastic deformation capacity of the mobile beam 30.

The mobile beam 30 is for example made of metal, such as gold, gold alloy, aluminium, aluminium alloy or any other adapted metal, or semiconductor, such as polysilicon, monocrystalline silicon, etc. It has a shape adapted to define an internal space 25 between said substrate 20 and the beam 30.

The substrate electrode 40 is arranged on the substrate 20, substantially at the centre of said internal space 25. The substrate electrode 40 is typically made from metal, semi-metal, semiconductor, or any other adapted material.

A generator 10 is connected to the beam 30 and to the substrate electrode 40 so that a difference in potential between the beam 30 and the substrate electrode 40 can be applied.

Pins 50 typically made of metallic material, semi-metal, semiconductor or any other adapted material are arranged on the substrate 20 opposite the stops 70 of the beam 30. The pins 50 are connected electrically to the terminal of the generator 10 connected to the beam 30, for example to the earth of the generator 10. The pins 50 are therefore electrically connected to the beam 30 and are at the same potential as the latter so as not to cause an electrical short-circuit.

The pins 50 have a role qualified a blocking element of charges, that is, they block the injection of electrical charges when the device is activated.

In fact, in the activation state, contact between the pins 50 and the stops 70 of the beam 30 blocks the injection of charges into the substrate 20 to the extent where the pins 50 and the beam 30 are connected electrically and are at the same potential.

Figure 6:
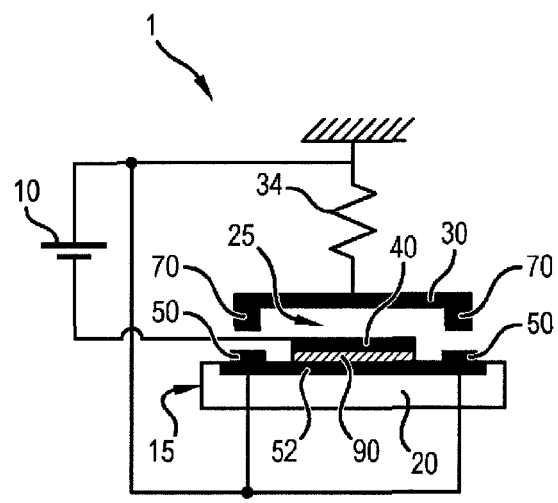
FIGS. 6 and 7 show another particular embodiment of the electromechanical microsystem according to the invention.
Figure 7:
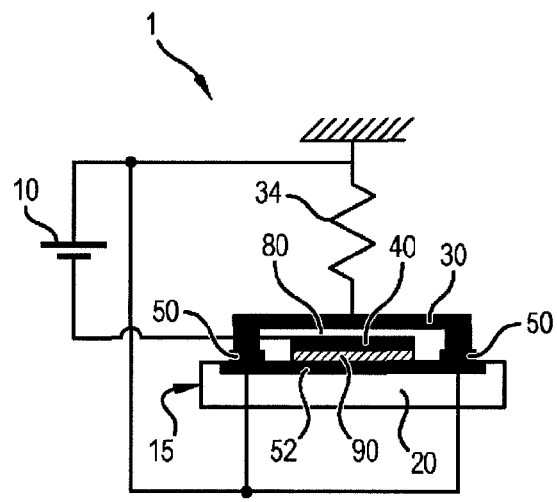

FIGS. 6 and 7 show another particular embodiment of the electromechanical microsystem 1 such as presented by FIGS. 4 and 5, in which the base 15 also comprises an electrically conductive base 52 adjacent to the substrate 20 and an electrically insulating layer 90 superposed on the base 52.

In this embodiment, the pins 50 are placed on the base 52 and are accordingly connected to the generator 10 by means of the conductive base 52 common to the pins 50 on which is arranged the layer insulating 90. The substrate electrode 40 is as such placed on the layer insulating 90, which insulates the substrate electrode 40 from the pins 50.

The insulating layer 90 is typically made from evaporation or pulverisation of material or a mixture of several materials, or again by chemical deposit in phase vapour assisted by plasma and other techniques of insulation deposit.

FIG. 7 shows the electromechanical microsystem 1 in the activation state, and illustrates the superposition of elements, specifically and respectively:

the beam 30;
the air-filled cavity 80;
the substrate electrode 40;
the insulating layer 90;
the conductive base 52 and the pins 50;
the substrate 20.

Relative to the embodiment shown in FIGS. 4 and 5, this embodiment improves the sensing and evacuation of electrical charges, by way of the conductive base 52 which constitutes a substantial sensing surface of the charges.

This is the assembly constituted by the pins 50 and the conductive base 52 which plays the role of blocking element of charges.

Figure 8:
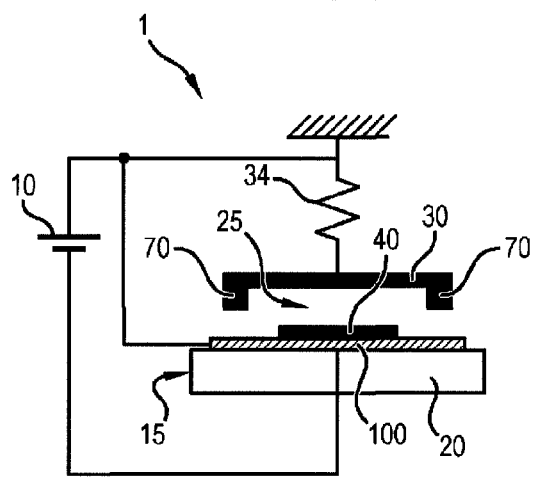
FIGS. 8 and 9 show another embodiment of the electromechanical microsystem according to the invention.
Figure 9:
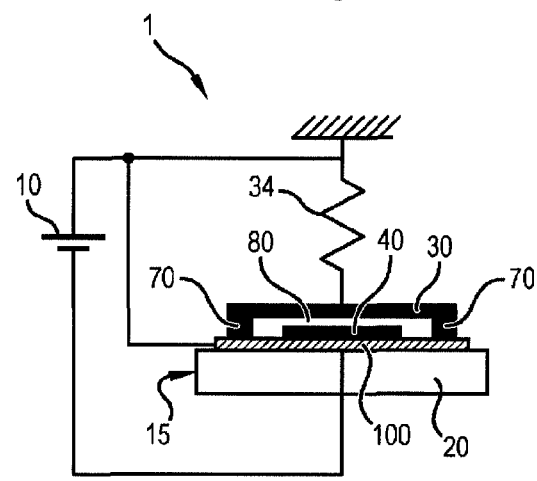

FIGS. 8 and 9 show another embodiment of the electromechanical microsystem 1 according to the invention.

In this embodiment, the electromechanical microsystem 1 comprises:

a beam 30 comprising mechanical stops 70;
an air-filled cavity 80;
a substrate electrode 40;
a strongly resistive layer 100; and
a substrate 20.

The strongly resistive layer 100, which is arranged directly on the substrate 20, is connected to the terminal of the generator 10 which is connected to the beam 30. The beam 30 and the strongly resistive layer 100 are therefore electrically connected.

Preferably, the material used to make the strongly resistive layer 100 has resistivity of between 100 MOhms·square and 10 kOhms·square. It is formed typically by an alloy of silicon chrome (SiCr), carbon of diamond structure (DLC), implanted silicon, or conductive oxide.

Several embodiments are possible for depositing this strongly resistive layer 100, especially by laser ablation, chemical deposit in vapour phase assisted by plasma or any other adapted method.

This embodiment is especially interesting due to the simplicity of structure of the resulting electromechanical microsystem 1 which can consequently be made easily.

In the activation state, the beam 30 comes into contact with the strongly resistive layer 100, at the level of the stops 70. The fact that the beam 30 and the strongly resistive layer 100 are electrically connected enables to block the injection of charges.

The strongly resistive layer 100 plays the role of element for blocking electrical charges. It indeed enables to blocks the injection of charges during activation of the device to the extent where the strongly resistive layer 100 and the beam 30 are at the same potential.

Also, placing the strongly resistive layer 100 on the substrate 20 enables to very finely adjust its characteristics, which enables to preserve the electrical performance of the microsystems.

Figure 10:
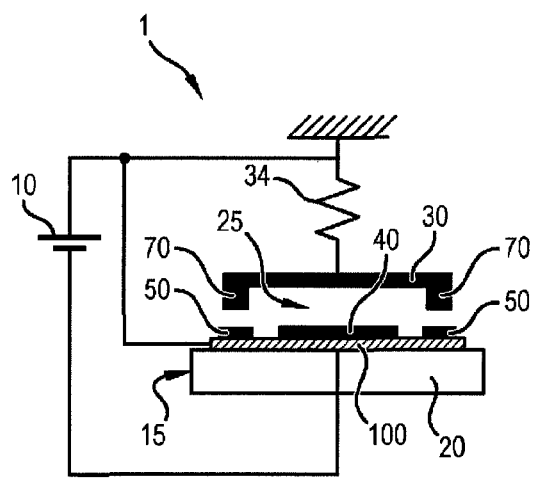
FIGS. 10 and 11 show another embodiment of the electromechanical microsystem according to the invention.
Figure 11:
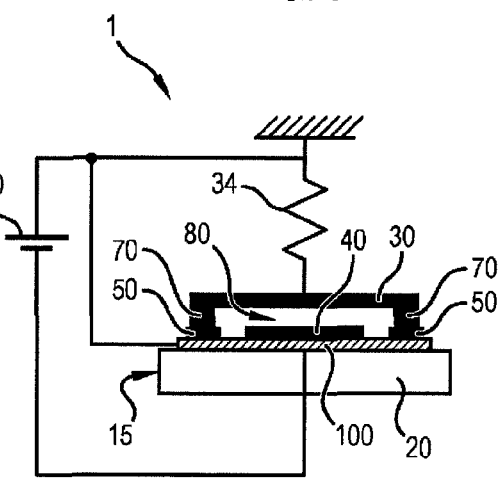

FIGS. 10 and 11 show, respectively in the rest state and in the activation state, another embodiment of the electromechanical microsystem 1 shown in FIGS. 8 and 9.

This embodiment resumes the structure presented in FIGS. 8 and 9, in which pins 50 arranged opposite the mechanical stops 70 of the beam 30 are added to the base 15 on the strongly resistive layer 100.

The connection between the beam 30 and the strongly resistive layer 100 is created during activation by means of the pins 50. It is therefore the assembly constituted by the pins 50 and the strongly resistive layer 100 which plays the role of element for blocking electrical charges.

Placing pins 50 to ensure contact enables the use of a specific material other than that of the resistive layer 100, and therefore offers an added degree of liberty.

These pins 50 can be made for example of material having a low friction coefficient, typically material selected from the platinum family, such as rhodium, ruthenium, platinum, etc. or other adapted materials.

The invention therefore proposes blocking injection of electrical charges when the device is in the activation state by the addition of a blocking element arranged opposite the mechanical stops 70 of the beam 30 and connected electrically to the beam 30.

This blocking element can be made according to several particular embodiments. These embodiments especially employ pins 50, a layer of strongly resistive material 100, a conductive base 52 and an insulating layer 90, these elements able to be taken individually or in combination such as described previously.

Strongly limiting or even preventing dielectrical charging between the beam 30 and the base 15, or more particularly between the beam 30 and the substrate 20, considerably prolongs the shelf life of the components. This switches from a shelf life of the electromechanical microsystems of the order of a few minutes or tens of minutes to a shelf life of the order of several months in continuous operation in the activated state.

Electromechanical microsystems according to the invention also demonstrate considerable performance stability over a large number of switchings during tests.

The invention claimed is:

1. An electromechanical microsystem comprising:
a base comprising a substrate and a substrate electrode fixed to the substrate,
a mobile beam suspended above the substrate,
a voltage generator, connected by a first terminal to the beam, and by a second terminal to the substrate electrode, adapted to generate a difference in potential between the beam and the substrate electrode, and
at least one mechanical stop connected to the beam and adapted to come into contact with the base during application of a difference in potential between the beam and the substrate electrode defining an air-filled cavity between the beam and the substrate electrode,
wherein said electromechanical microsystem also comprises an element for blocking electrical charges arranged on the substrate, opposite the at least one mechanical stop, and connected electrically to the beam,
wherein said element for blocking electrical charges is constituted by a layer of resistive material having an electrical resistivity between 100 MOhms·square and 10 kOhms·square.

2. The electromechanical microsystem according to claim 1, wherein at least one metal pin is arranged on said layer of resistive material, opposite a mechanical stop of the beam.

3. The electromechanical microsystem according to claim 1, wherein said material constituting the element or blocking electrical charges is an alloy of silicon chrome, carbon of diamond structure, implanted silicon, or a conductive oxide.

4. The electromechanical microsystem according to claim 1, wherein said substrate is made of material from at least one of the following materials: ceramic, sapphire, quartz, molten silica, crystalline substrates, semiconductors, and polymers.

5. The electromechanical microsystem according to claim 1, wherein the mobile beam is made of metal such as gold, gold alloy, aluminium, aluminium or semiconductor alloy, such as polysilicon or monocrystalline silicon.

6. The electromechanical microsystem according to claim 1, wherein said element for blocking electrical charges comprises at least one pin made from metallic material.

7. A capacitive electromechanical microsystem according to claim 1, wherein said stop is adapted to maintain a thickness of air between the beam and the substrate electrode of between 0.1 and 2 µm.

8. The electromechanical microsystem according to claim 6, wherein said metallic metal is selected from the family of platinum, such as rhodium, ruthenium, platinum, semi-metal or semiconductor.

* * * * *

UNITED STATES PATENT AND TRADEMARK OFFICE
CERTIFICATE OF CORRECTION

PATENT NO. : 8,941,452 B2  
APPLICATION NO. : 13/814928  
DATED : January 27, 2015  
INVENTOR(S) : Pierre Blondy et al.

Page 1 of 1

It is certified that error appears in the above-identified patent and that said Letters Patent is hereby corrected as shown below:

In the Claims,
Column 7, Claim 3, line 5, please delete "or" and insert --for--.

Signed and Sealed this  
Twenty-third Day of June, 2015

Michelle K. Lee  
*Director of the United States Patent and Trademark Office*